(12) United States Patent
Soda et al.

(10) Patent No.: US 7,541,281 B2
(45) Date of Patent: Jun. 2, 2009

(54) METHOD FOR MANUFACTURING ELECTRONIC DEVICE

(75) Inventors: Eiichi Soda, Ibaraki (JP); Hitoshi Ishimori, Ibaraki (JP)

(73) Assignee: NEC Electronics Corporation, Kanagawa (JP)

( * ) Notice: Subject to any disclaimer, the term of this patent is extended or adjusted under 35 U.S.C. 154(b) by 343 days.

(21) Appl. No.: 11/258,189

(22) Filed: Oct. 26, 2005

(65) Prior Publication Data

US 2006/0094221 A1    May 4, 2006

(30) Foreign Application Priority Data

Nov. 1, 2004    (JP)    ............... 2004-317717

(51) Int. Cl.
 *H01L 21/4763*    (2006.01)
(52) U.S. Cl. ............... 438/638; 257/E21.579; 438/597
(58) Field of Classification Search ........... 438/597, 438/638; 257/E21.579
 See application file for complete search history.

(56) References Cited

U.S. PATENT DOCUMENTS 7,048,869 B2 *   5/2006  Takahashi et al.  ............ 216/70
2002/0197846 A1 * 12/2002  Suzawa et al.  ............. 438/622
2005/0009324 A1 *  1/2005  Li et al.  ................... 438/637
2005/0233572 A1 * 10/2005  Su et al.  ................... 438/618
2007/0087554 A1 *  4/2007  Louis  ....................... 438/618

FOREIGN PATENT DOCUMENTS

JP    2004-111950    4/2004

OTHER PUBLICATIONS

Quirk, M. et al., Semiconductor Manufacturing Technology, 2001, Prentice-Hall, p. 351.*

* cited by examiner

*Primary Examiner*—Asok K Sarkar
(74) *Attorney, Agent, or Firm*—Young & Thompson

(57) ABSTRACT

A method for manufacturing an electronic device, in which a via hole and a trench for an interconnect are integrally provided in an interlayer insulating film formed on a substrate, and the via hole and the trench for the interconnect are plugged with an electric conductor film is provided. The method includes: forming a via hole in the interlayer insulating film; forming a resin film plugging the via hole on the interlayer insulating film; etching the resin film exposed outside the via hole off with an etching gas mainly containing an active hydrogen species to form a dummy plug composed of the resin film in the via hole; forming a resist mask having an opening for an interconnect on the dummy plug and on the interlayer insulating film.

11 Claims, 9 Drawing Sheets

METHOD FOR MANUFACTURING ELECTRONIC DEVICE

This application is based on Japanese patent application NO.2004-317,717, the content of which is incorporated hereinto by reference.

BACKGROUND

1. Technical Field

The present invention relates to a method for manufacturing an electronic device.

2. Related Art

In recent years, remarkably increasing processing speed of the semiconductor device leads to a problem of generating a transmission delay due to a decrease in a signal propagation rate, which is caused by an interconnect resistance in a multilayer interconnect and a parasitic capacitance between the interconnects. Such problem tends to become more and more considerable, due to an increased interconnect resistance and an increased parasitic capacitance, which are caused in accordance with miniaturizations of a linewidth and an interconnect interval created by an increased integration of the semiconductor device. Consequently, in order to prevent a signal delay caused on the basis of enhancements in the interconnect resistance and in the parasitic capacitance, it has been attempted that a copper interconnect is introduced as a substitute for the conventional aluminum interconnect, and a low dielectric constant film (hereinafter referred to as "low-k film") is employed for an interlayer insulation film. Here, the low dielectric constant film may be an insulating film having a relative dielectric constant lower than a relative dielectric constant of a silicon dioxide ($SiO_2$) film of 3.9.

A damascene process is a process for forming the above-described copper interconnect. This is a technology of forming the interconnects without etching copper, in view of the fact that control of the etch rate for copper (Cu) is difficult as compared with aluminum (Al), or more specifically, this is a damascene interconnect (trench interconnect) technology, in which trenches for interconnects (trenches) or connection apertures (via holes) are formed in an interlayer insulating film via a dry etching process and then such trenches or via holes are filled with copper or copper alloy.

In so-called dual damascene interconnect technology, in which trenches (trenches for dual damascene interconnects) formed by connecting the above-described trench with the via holes are provided in the above-described interlayer insulating film and then the trenches and via holes are integrally plugged with an interconnect material film, various types of formation processes are energetically developed toward the practical use thereof (see, for example, Japanese Laid-open patent publication No. 2004-111,950). Such process for forming the dual damascene interconnect can be roughly classified into a via first process, a trench first process and a dual hard masking process, depending on differences in the process for forming a trench for the above-described dual damascene interconnect. In these processes, the via first process and the trench first process commonly involve forming trenches for dual damascene interconnects via a dry etching process of the interlayer insulating film employing a resist mask. The via first process further involves, at first, forming via holes, and then forming trenches, and the trench first process further involves, inversely, at first, forming trenches, and then forming via holes. On the contrary, the above-described dual hard masking process involves collectively forming the trenches for dual damascene interconnects via a dry etching process of the interlayer insulating film employing a hard mask.

Amongst the above-described dual damascene interconnect technologies, the above-described via first process has the following benefits, as compared with other processes. That is, compatibility thereof with the single damascene process is higher and thus a conversion thereto is easier in the photolithography process and the dry etching process, and a reduction of leakage current between the damascene interconnects is facilitated. Accordingly, investigations on the above-described via first process aiming for providing the practical use are widely carried out in recent days.

However, when the trench opening is formed by the via first process in a conventional process, problems of causing fluctuation in a pattern dimension or causing a pattern-collapse of a patterned resist for forming the trench opening have been arisen.

SUMARY OF THE INVENTION

According to the present invention, there is provided a method for manufacturing an electronic device, in which a via hole and a trench for an interconnect are integrally provided in an interlayer insulating film formed on a substrate, and the via hole and the trench for the interconnect are plugged with an electric conductor film. The method includes: forming a via hole in the interlayer insulating film; forming a resin film on the interlayer insulating film, the resin film plugging the via hole; etching the resin film exposed outside the via hole off with an etching gas mainly containing an active hydrogen species to form a dummy plug composed of the resin film in the via hole; forming a resist mask having an opening for an interconnect on the dummy plug and on the interlayer insulating film; and etching the interlayer insulating film through a mask of the resist mask to form a trench for the interconnect, the trench being connected with the via hole.

According to the configuration of the present invention, a trench for a dual damascene interconnect having a fine structure and an improved quality can be formed with an improved controllability, and therefore production yield for the electronic device comprising the dual damascene interconnect can be improved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferred embodiments of the present invention will be described as follows in reference to the annexed figures.

A procedure for forming a dual damascene interconnect by the via first process will be described in reference to FIGS. 1A to 1C, FIGS. 2A to 2C and FIGS. 3A to 3C. FIGS. 1A to 1C, FIGS. 2A to 2C and FIGS. 3A to 3C are cross-sectional views of the device for describing respective operations for forming the dual damascene interconnect by the via first process.

Figure 1A:
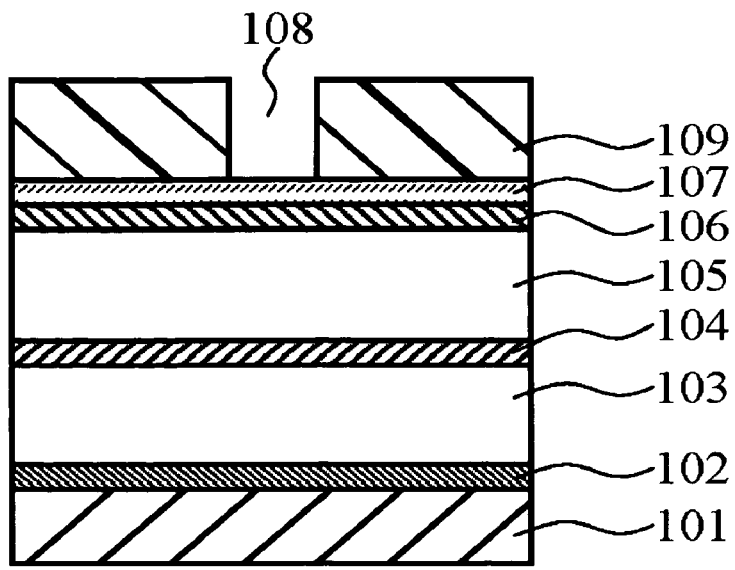
FIGS. 1A to 1C are cross-sectional views of a semiconductor device, illustrating a formation process for a dual damascene interconnect according to an embodiment of the present invention.

First, as shown in FIG. 1A, a via etch stop layer 102 functioning as an insulating barrier layer is deposited on an underlying interconnect 101. The underlying interconnect 101 may be a copper interconnect. The via etch stop layer 102 may be composed of, for example, silicon carbide (SiC) film, silicon carbonitride (SiCN) film, or the like. The via etch stop layer 102 may be selected as having a film thickness of, for example, on the order of 25 nm, and may be an SiC film having a relative dielectric constant of about 3.5.

Subsequently, a first low dielectric constant film 103, a trench etch stop layer 104, a second low dielectric constant film 105 and a cap layer 106 are deposited on the via etch stop layer 102.

The first low dielectric constant film 103 and the second low dielectric constant film 105 may be composed of a low-k film having a relative dielectric constant of, for example, equal to or less than 3. The low-k film may be composed of, for example, carbon-containing silicon oxide film (SiOC film), methyl silsesquioxane (MSQ) film or the like. The SiOC film may be deposited via, for example, a chemical vapor deposition (CVD). The MSQ film may be formed via a coating process, for example. The constitution of the MSQ film may be formulated to be, for example, $[CH_3SiO_{3/2}]_n$.

Further, the Low-k film may also be composed of, for example, a porosified insulating film such as a porous MSQ film (p-MSQ film) and the like. This can provide a reduced relative dielectric constant of the low-k film, and the relative dielectric constant may be, for example, equal to or less than 2.5.

The first low dielectric constant film 103 may be a p-MSQ film having, for example, a relative dielectric constant of on the order of 2.5, and a film thickness of on the order of about 150 nm. The P-MSQ film may be deposited by employing a spin coating process.

The second low dielectric constant film 105 may also be composed a p-MSQ film formed by the spin coating process, similarly as the first low dielectric constant film 103. The film thickness of the second low dielectric constant film 105 may be, for example, on the order of about 150 nm.

The trench etch stop layer 104 may be at least an insulating film, which is a different type from the second low dielectric constant film 105 or the via etch stop layer 102. The trench etch stop layer 104 may be composed of, for example, SiC film, SiCN film, SiOC film, silicon nitride (SiN) film or the like. The trench etch stop layer 104 may be, for example, an SiOC film having a film thickness of about 30 nm and a relative dielectric constant of about 2 to 3. Such SiOC film may be deposited via a CVD process.

The cap layer 106 may be composed of an $SiO_2$ film or the like. A film thickness of the cap layer 106 may be on the order of 80 nm. The cap layer 106 may be formed similarly as forming the trench etch stop layer 104. Alternatively, in another case, the electronic device may have a configuration that does not include cap layer 106.

As described above, the interlayer insulating film including the via etch stop layer 102, the first low dielectric constant film 103, the trench etch stop layer 104, the second low dielectric constant film 105 and the cap layer 106 is formed.

Next, a first anti-reflection film 107 is formed on the surface of the cap layer 106. Thereafter, a first resist mask 109 having a via opening 108 is formed on the first anti-reflection film 107 via a photolithographic technology. An aperture size of the via opening 108 may be, for example, about 100 nm. Having such condition, a configuration shown in FIG. 1A can be obtained.

Figure 1B:
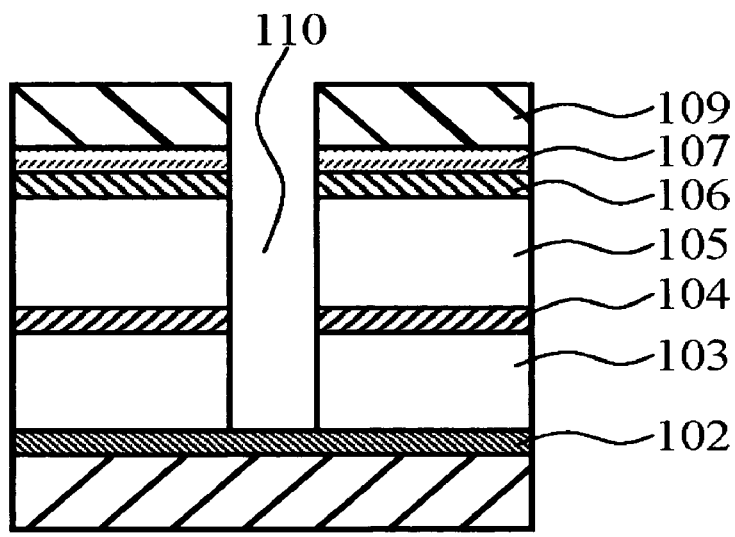

Subsequently, as shown in FIG. 1B, the first anti-reflection film 107, the cap layer 106, the second low dielectric constant film 105, the trench etch stop layer 104 and the first low dielectric constant film 103 are sequentially dry etched via a reactive ion etching (RIE) through the first resist mask 109 as a mask for the dry etching process to form a via hole 110. When the aperture diameter of the via opening 108 is about 100 nm, the aperture of the via hole 110 may be also about 100 nm. In this case, a fluorocarbon-containing gas of $C_4F_8$/Ar/$N_2$, for example, may be employed as a gas for etching (an etching gas) in the dry etching process for the first antireflection film 107, the cap layer 106, the second low dielectric constant film 105, the trench etch stop layer 104, and the first low dielectric constant film 103. At this time, the via etch stop layer 102 is not etched.

Figure 1C:
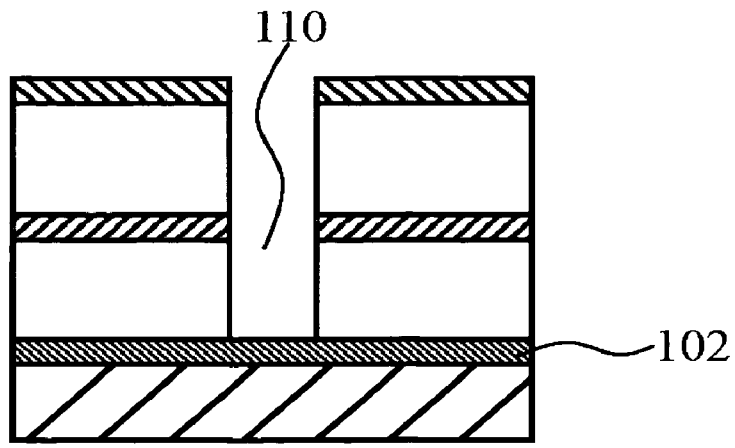

Next, the first resist mask 109 and the first anti-reflection film 107 are removed via an ashing process, and then are cleaned with a chemical solution. The via hole 110 extending to the surface of the via etch stop layer 102 of the interlayer insulating film is formed by this operation, as shown in FIG. 1C.

Figure 2A:
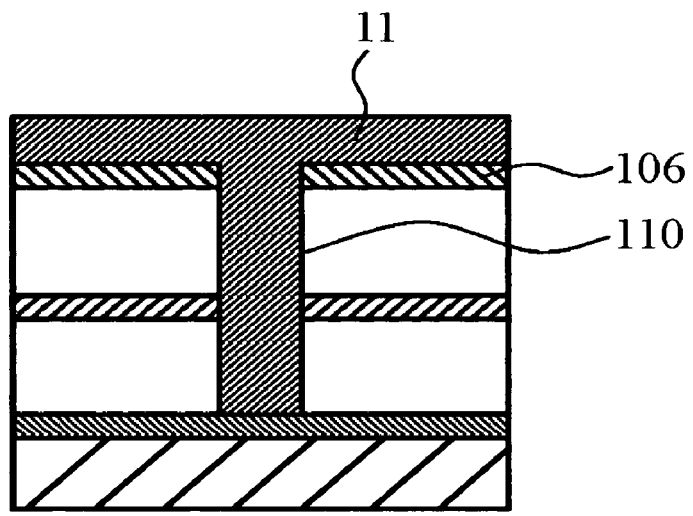
FIGS. 2A to 2C are cross-sectional views of the semiconductor device, illustrating the formation process for the dual damascene interconnect, subsequent to the process shown in FIGS. 1A to 1C.

Then, as shown in FIG. 2A, a resin film 11 is formed to cover the cap layer 106 and plug the via hole 110 by employing a spin coating process. The film thickness of the resin film 11 may be, for example, about 150 nm. As for the resin film 11, for example, "NCA 2131" (trade name), commercially available from Nissan Chemical Industries, Co. Ltd., may be used. Subsequently, the resin film 11 is cured by thermally processing (baking process) thereof at a temperature of, for example, about 100 to 225 degree C. Here, the resin film 11 may be formed by employing, for example, novolak type phenolic resin. In addition, an organic polymer having thermosetting nature and being composed of various types of compositions may also be employed for the resin film 11.

Figure 2B:
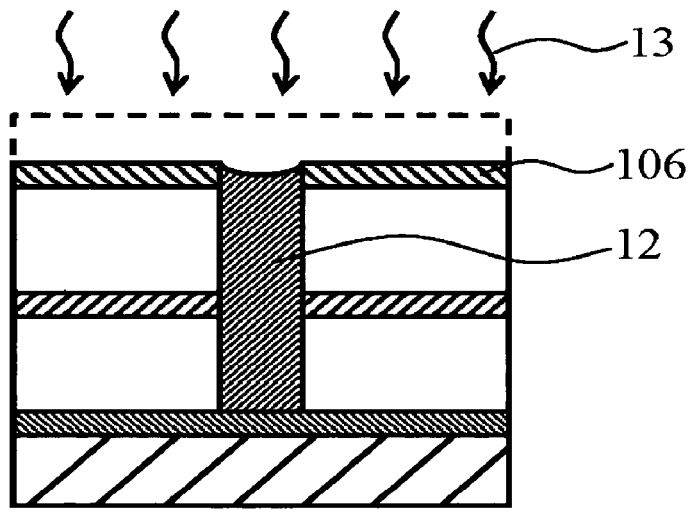

Next, as shown in FIG. 2B, the portion of the resin film 11 exposed outside the via hole 110 is removed by an etching process to form a dummy plug 12 composed of the resin film 11 in the via hole 110. Having such procedure, the dummy plug 12 plugging the via hole 110 is formed.

In this case, a hydrogen (H$_2$) active species 13 may be employed for the etching gas that etches the resin film 11. The active hydrogen species 13 may be formed by plasma-exciting hydrogen gas or a gaseous mixture of hydrogen gas and an inert gas. Argon (Ar) gas or helium (He) gas may be employed for the inert gas in such case. The active hydrogen species 13 may also be a hydrogen plasma. The resin film 11 can be selectively removed via a dry etching process by applying a hydrogen plasma over the surface of the resin film 11. The hydrogen plasma may be a high-density plasma (HDP) that can be created by employing a dual-frequency plasma-exciting parallel-plate RIE apparatus, which applies radio frequency waves of, for example, 60 MHz and 2 MHz to the upper electrode and the lower electrode, respectively. The plasma excitation of hydrogen gas can be promoted and the dissociation thereof can be facilitated by including an inert gas in the active hydrogen species.

The etching process for the resin film 11 may be continued until the portion of the resin film 11 on the cap layer 106 is removed to expose the cap layer 106. The end point of the etching process for the resin film 11 can be determined by an end point detection process utilizing a measurement of a variation in the intensity of the plasma emission. In this case, when the etching time of resin film 11 is increased, the upper portion of the dummy via 12 in the via hole 110 is also etched off. On the contrary, when the etching time for the resin film 11 is excessively shorter, the resin film 11 is partially remained on the surface of the cap layer 106. As will be discussed later, an anti-reflection film is formed on the cap layer 106. If the upper portion of the dummy via 12 in the via hole 110 has been removed, or if the resin film 11 is partially remained on the surface of the cap layer 106 in such occasion, a problem of a failure in forming a flat anti-reflection film is occurred. Therefore, the etching process for the resin film 11 should be adequately controlled. In the present embodiment, the etching process for the resin film 11 can be adequately controlled by employing an active hydrogen species for the etching gas.

Here, the etchback for the resin film 11 may be conducted from the start to the end point by employing an etching gas that mainly contains an active hydrogen species. Here, the term "mainly contains an active hydrogen species" indicates that the etching gas is composed substantially of an active hydrogen species.

Figure 9A:
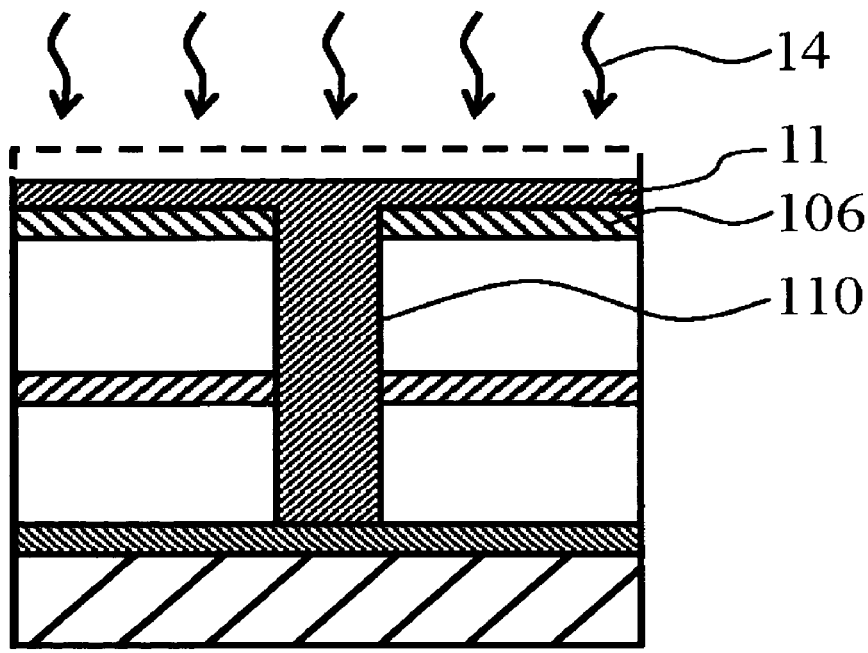
FIGS. 9A and 9B are cross-sectional views of the semiconductor device, illustrating the formation process for the dual damascene interconnect.
Figure 9B:
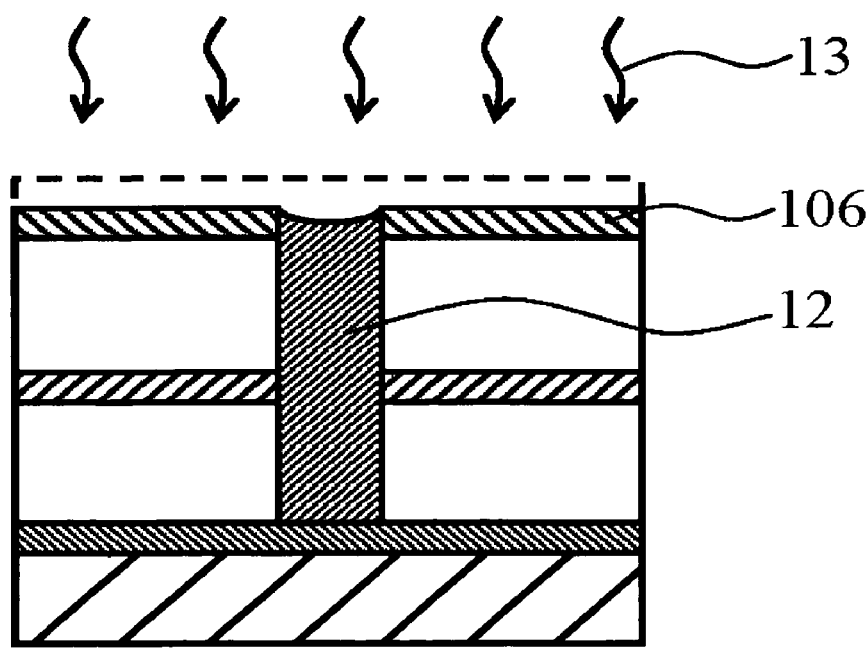

An alternative example may be a two-step etchback process for the resin film 11, as shown in FIGS. 9A and 9B. In this case, in the first stage (FIG. 9A), an etching gas that promotes higher etch rate than the etching gas that mainly includes an active hydrogen species is employed to partially remove the resin film 11. In this occasion, an active oxygen species 14 may be employed for the etching gas. The active oxygen species 14 may be formed by plasma-exciting oxygen gas or a gaseous mixture of oxygen gas and an inert gas. The active oxygen species 14 may be an oxygen plasma. In the first stage, the etchback for the resin film 11 may be proceeded halfway, e.g., the etchback may be continued until the cap layer 106 is nearly exposed. The first stage may be implemented within previously determined time, for example. Then, the resin film 11 is etched back employing the active hydrogen species 13 in the second stage (FIG. 9B). In this case, an end point of the etching process for the resin film 11 may be determined by an end point detection process utilizing a measurement of a variation in the intensity of the plasma emission. Having such configuration, the etching process for the resin film 11 can be conducted at higher rate and the etching process for the resin film 11 can be adequately controlled. When the configuration having an electronic device that does not include cap layer 106 is employed, the end point of the etching process for the resin film 11 may be selected to be a point when the second low dielectric constant film 105 is exposed.

Figure 2C:
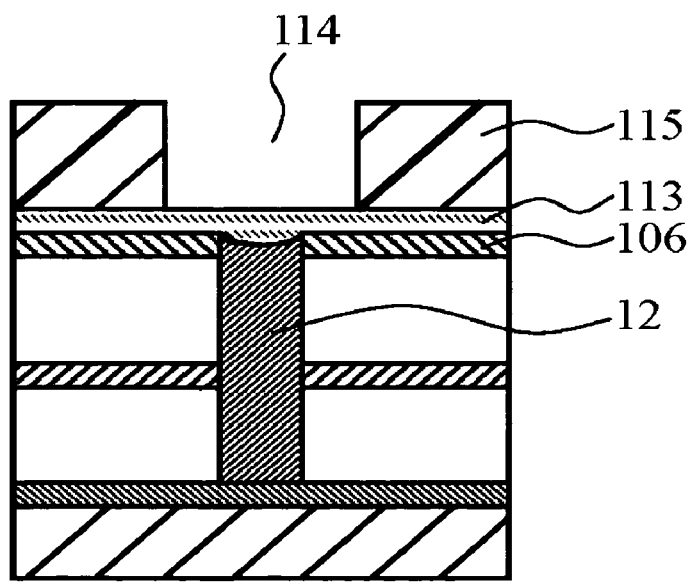

Next, as shown in FIG. 2C, a second anti-reflection film 113 is formed so as to coat the surface of the cap layer 106 and the dummy plug 12. Subsequently, a second resist mask 115 having a trench opening 114 is formed on the second anti-reflection film 113 by a photolithographic technology. The film thickness of the second resist mask 115 may be, for example, about 280 nm. The width of the trench opening 114 may be, for example, about 100 nm. The pattern aspect ratio of the resist mask 115 may be about 5.

Figure 3A:
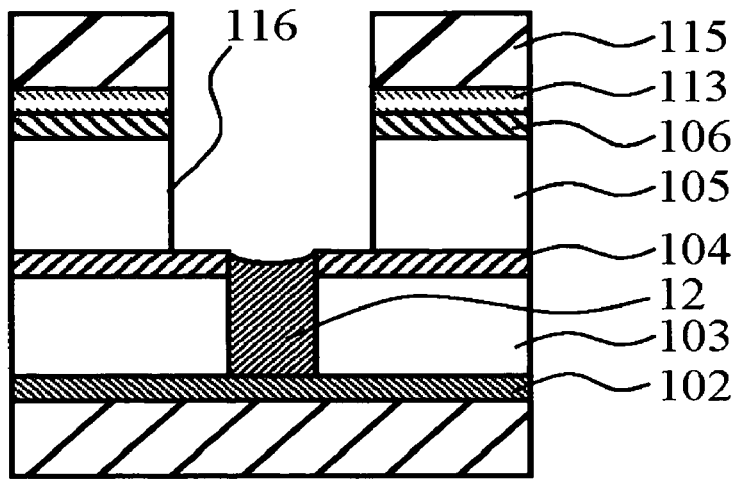
FIGS. 3A to 3C are cross-sectional views of the semiconductor device, illustrating the formation process for the dual damascene interconnect, subsequent to the process shown in FIGS. 2A to 2C.

Then, as shown in FIG. 3A, the second anti-reflection film 113, the cap layer 106 and the second low dielectric constant film 105 are sequentially dry etched by RIE through a dry etching mask of the second resist mask 115 to form a trench 116 having an interconnect pattern.

In this case, a fluorocarbon-containing gas such as, for example, CF$_4$/Ar/N$_2$ or the like may be employed for the etching gas. In addition to these, as for such etching gas, at least a source gas selected from the group consisting of fluorocarbon gases having a general formula of CxHyFz (where x, y, z are integer numbers that satisfy $X \geq 1$, $Y \geq 0$ and $Z \geq 1$) may be employed.

In this dry etching process, the dummy plug 12 provides a protection of the via etch stop layer 102 from a damage caused by the above-described RIE, and the first trench etch stop layer 104 functions as a protective mask for the low dielectric constant film 103 from a damage caused by the above-described RIE.

Figure 3B:
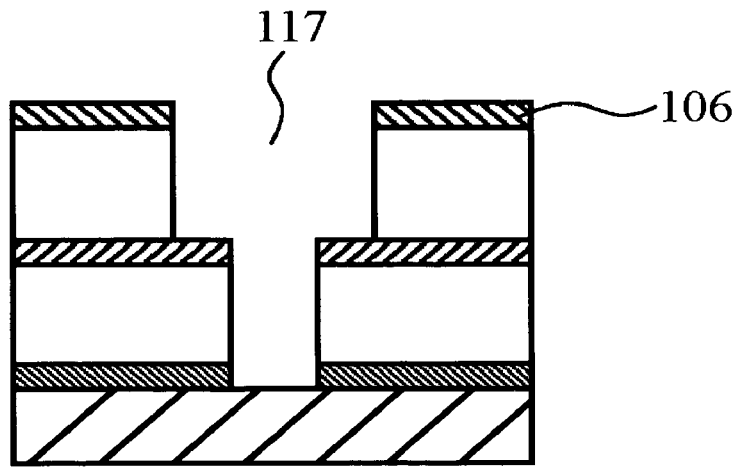

Next, as shown in FIG. 3B, the second resist mask 115, the second anti-reflection film 113 and the dummy plug 12 are removed via an ashing process. Subsequently, the via etch stop layer 102 is selectively removed by a dry etching process through a hard mask of the cap layer 106. Here, a gaseous mixture of CHF$_3$/Ar/N$_2$, a gaseous mixture of CF$_4$/Ar/N$_2$ or the like may be plasma-excited to be employed for the gas for etching (etching gas). Having this configuration, the trench 117 for the dual damascene interconnect extending to the surface of the underlying interconnect 101 is formed. Then, a cleaning process with a liquid chemical solution is conducted.

Figure 3C:
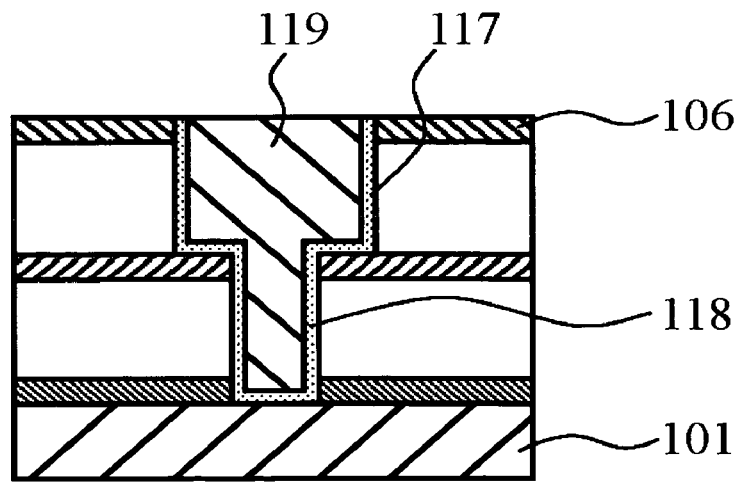

Next, as shown in FIG. 3C, a barrier metal such as tantalum (Ta), tantalum nitride (TaN) or the like is deposited. The barrier metal may be deposited via a sputtering process or an atomic layer deposition (ALD) process. Subsequently, a formation of a Cu seed and a metal plating of Cu are conducted to form an interconnect material film. Then, an unwanted portion of the interconnect material film on the surface of the cap layer 106 is polished to be removed via a chemical mechanical polishing (CMP). In this way, an electroconductive barrier layer 118 that is coupled to the underlying interconnect 101 and a dual damascene interconnect 119 are formed in the above-described trench 117 for the dual damascene interconnect. In such case, the barrier layer 118 may have a layered structure of the Ta film/TaN film having a film thickness of about 5 nm to 10 nm. In addition, a line width of the dual damascene interconnect 119 may be about 100 nm.

As described above, the dual damascene interconnect as the upper layer interconnect that is connected to the underlying interconnect 101 is formed on the interlayer insulating film having an effective relative dielectric constant of equal to or less than 3.0. Having such procedure, a dual layer interconnect having the dual damascene interconnect structural member is formed.

Next, advantageous effects obtainable by employing the process for manufacturing the electronic device in the present embodiment will be described. In the process according to the present embodiment, various advantageous effects can be obtained by adequately controlling the etching process for the resin film 11 in the process for etching back the resin film 11 shown in FIG. 2B.

First, problems arisen in the case of failing to provide an adequate control in the etching operation for the resin film 11 in the process of etching back the resin film 11 shown in FIG. 2B will be described in reference to FIGS. 4A to 4C, FIG. 5 and FIGS. 6A to 6C. For example, in the operation for etching back the resin film 11, suitable control in the etching operation can not be presented, if an active oxygen species is employed from the start to the end.

Figure 4A:
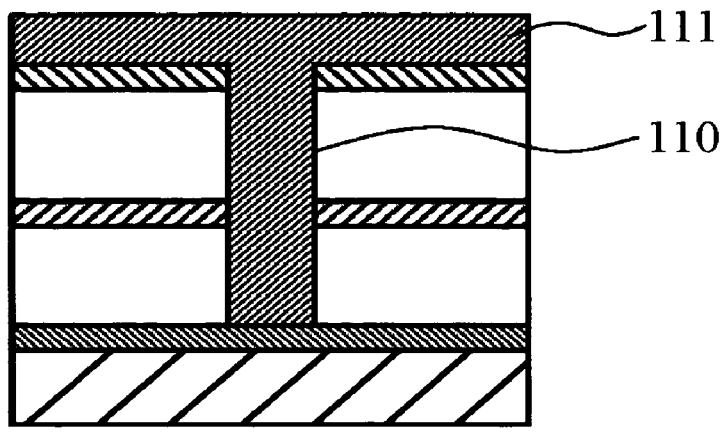
FIGS. 4A to 4C are cross-sectional views of the semiconductor device, illustrating another formation process for a dual damascene interconnect according to an embodiment of the present invention, subsequent to the process shown in FIGS. 1A to 1C.

The resin film 111 of FIG. 4A may be configured similarly as the resin film 11 shown in FIG. 2A. In the operation for etching back the resin film 111, if the resin film 111 is dry etched by using an etching gas including an active oxygen species from the start to the end, as shown in FIG. 4B, the etching of the resin film 111 on the side wall of the via hole 110 is easily proceeded, and thus a protruding portion 112a may be formed within the dummy plug 112 after the etchback.

Figure 6A:
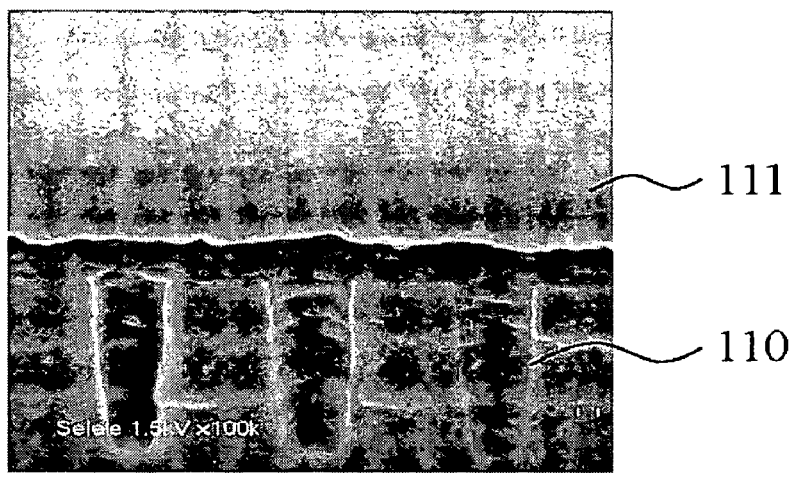
FIGS. 6A to 6C are cross-sectional views of configurations of a dual damascene interconnect.
Figure 6B:
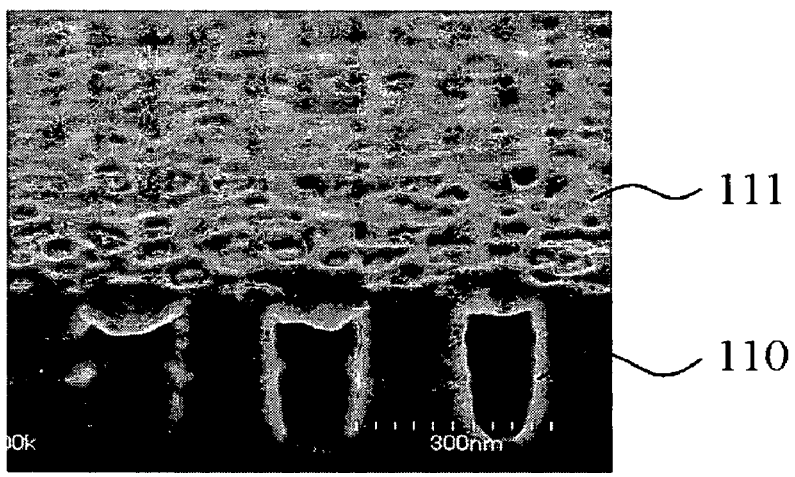
Figure 6C:
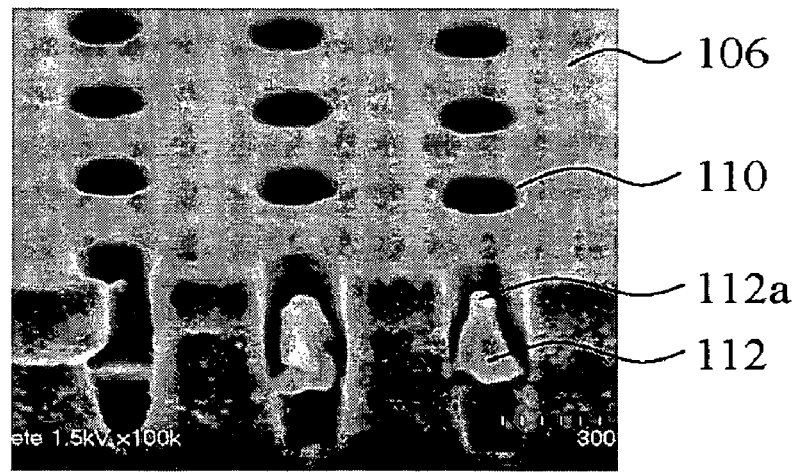

This phenomenon will be further described employing FIGS. 6A to 6C. FIGS. 6A to 6C are scanning electron microscope (SEM) structure showing cross-sectional views of a test element group (TEG) manufactured for a testing.

Figure 4B:
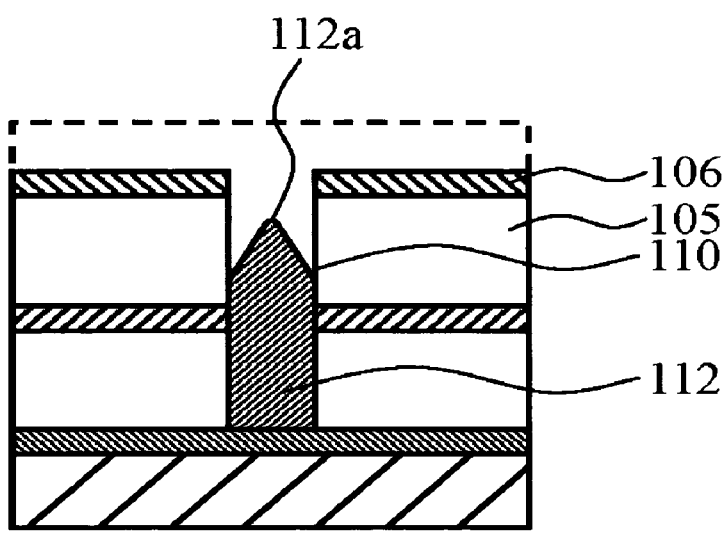
Figure 4C:
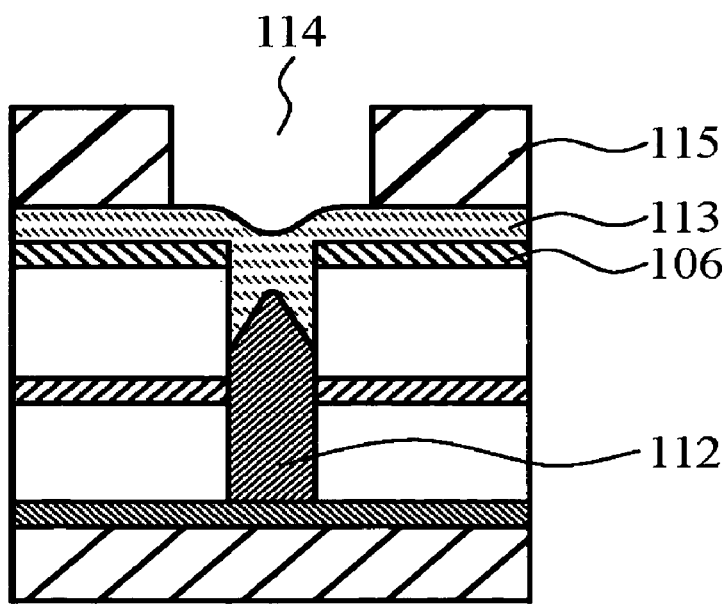

In FIGS. 6A to 6C, same numeral number is assigned to same element appeared in FIGS. 4A to 4C. FIG. 6A presents a condition before etchback, and FIG. 6A corresponds to FIG. 4A. FIG. 6B presents a condition in a mid way of the etching process in the etchback process (half way), and the resin film 111 remains on the surface of the cap layer 106. FIG. 6C presents a condition of the end of etchback and FIG. 6C corresponds to FIG. 4B.

As shown in FIG. 6B, in the etchback operation employing an etching gas formed by plasma exciting a gas containing oxygen (gaseous mixture of $O_2/Ar$), rough surface of resin film 111 is easily occurred in the operation of the etchback, and the uniformity in the etchback is deteriorated.

In addition, as shown in FIG. 6C, the resin film disposed on the side wall of the via hole 110 is easy to be etched, and thus a protruding portion 112a explained above may be formed.

When the protruding portion 112a explained above is formed in the etchback operation, the following problems are occurred. First, the second anti-reflection film 113 described in reference to FIG. 4C can not be uniformly formed in this region, larger variation in the film thickness is generated to provide an uneven antireflective effect. Then, variation in the pattern dimension of the trench opening 114 formed in the photolithographic operation is occurred. In addition, a pattern-collapse of the patterned resist that is formed to have a constant interconnect pitch and has a trench opening 114 is occurred. These problem are more remarkable when the miniaturization of a damascene interconnect proceeds.

Figure 5:
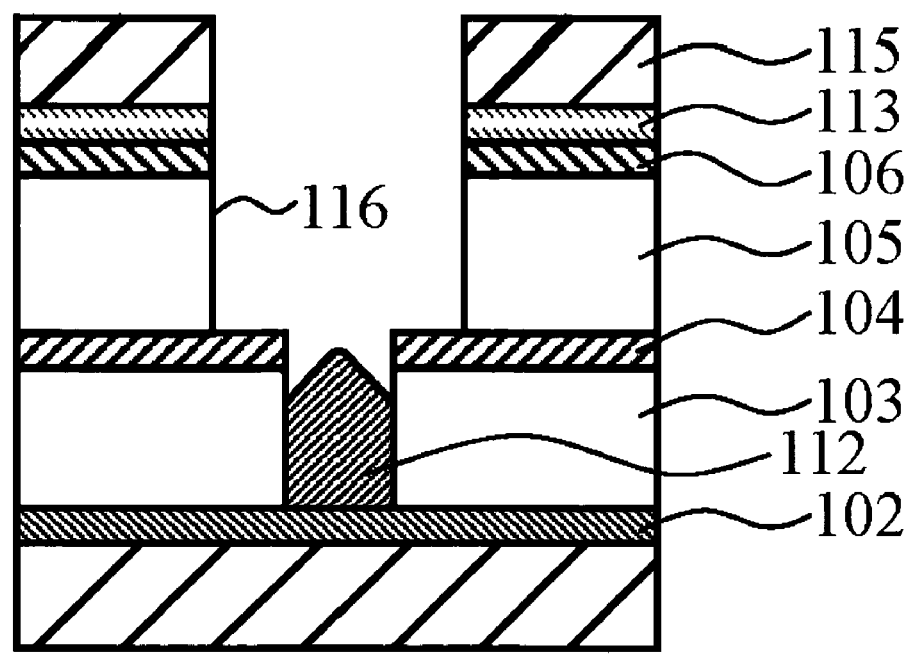
FIG. 5 is a cross-sectional view of the semiconductor device, illustrating the formation process for the dual damascene interconnect, subsequent to the process shown in FIGS. 4A to 4C.

Moreover, when a surface roughness of the resin film is occurred in the etchback operation, control of the end point of the etchback time utilizing the measurement of the variation in the intensity of the plasma emission becomes to be difficult. Therefore, variations in the height of the dummy plug 112 on the semiconductor wafer is increased. Further, the quantity of etchback is increased, so that the dummy plug 112 is retracted to reduce the height thereof, as shown in FIG. 4B. As such, when the second low dielectric constant film 105 is exposed on the side wall of the via hole 110, the side wall thereof is exposed to the oxygen plasma. As a result, organic components in the second low dielectric constant film 105 is substituted with oxygen atoms to increase the relative dielectric constant of the second low dielectric constant film 105. Further, in the case that the second low dielectric constant film 105 is formed of a porous film, the exposure of the side wall to the oxygen plasma causes damages such as void and the like is caused in the second low dielectric constant film 105. As such, a deterioration in the reliability of the interlayer insulating film and an increase of the leakage current between damascene interconnects are caused. Further, as shown in FIG. 5, the side wall of the first low dielectric constant film 103 is also exposed, when the trench 116 having the interconnect pattern is formed. Therefore, there is the fear that a damage may also be caused in the first low dielectric constant film 103.

On the other hand, as described in reference to FIG. 2B, the following advantageous effects are obtained by suitably controlling the etching process for the resin film 11.

First, the dummy plug 12 can uniformly plug the via hole 110. More specifically, the upper surface of the dummy plug 12 can be formed to be substantially flat. Thus, the second anti-reflection film 113 can be formed to have an uniform film thickness. Therefore, an even antireflection advantageous effect is obtained in formation of the second resist mask 115. In addition, the trench opening 114 of the second resist mask 115 can be formed to have an uniform pattern dimension with higher precision.

Further, even if the patterned resist for the trench opening 114 formed to have an interconnect pitch is miniaturized to have the aspect ratio of equal to or higher than 5 as stated above, a problem of a collapse of the patterned resist can be prevented. Such advantageous effects are more remarkable when the dimension of the damascene interconnect is miniaturized.

Further, as stated above, smooth surface of the resin film can be presented in the etchback process. Then, control of the end point of the etchback time utilizing the measurement of the variation in the intensity of the plasma emission becomes to be easier. As such, variation in the height of the dummy plug 12 is reduced in the surface of the semiconductor wafer. Further, the etch rate for the resin film at the time of detecting the end point is smaller in comparison with a case of employing a gas containing oxygen. Because of these reasons, setting of the over etching time after the detected end point and the etching control thereof can be facilitated. As such, the remaining resin film 11 on the surface of cap layer 106 is considerably reduced, such that the production yield for the semiconductor device is improved.

Further, even if the dummy plug 12 is retracted in the etchback process to expose the second low dielectric constant film 105 in the via hole 110, an increase in the relative dielectric constant of the second low dielectric constant film 105 can be prevented by employing a hydrogen plasma as the etching gas at least in the end point, even in the case of the exposure of the second low dielectric constant film 105 to the etching gas. Therefore, considerably higher process flexibility can be presented. Having this configuration, the manufacturing cost of the semiconductor device having the dual damascene interconnect structural member can be reduced.

Then, in the case that the second low dielectric constant film 105 is formed of a porous film, a formation of the void in the second low dielectric constant film 105 or causing of a damage that leads to an enlargement of the aperture can be prevented even if the side wall is exposed to the etching gas, by employing a hydrogen plasma as the etching gas at least in the end point. In particular, the damage of the above-described second low dielectric constant film can hardly be occurred by utilizing hydrogen radical as the active hydrogen species. Therefore, a deterioration in the reliability of the interlayer insulating film and an increase of the leakage current between damascene interconnects, which are otherwise occurred when oxygen-containing gas is employed, can be prevented even if a porosified low-k film is employed. Having this configuration, further reduction in the dielectric constant of the interlayer insulating film can be achieved, thereby promoting the increase in the operating rate of the semiconductor device.

Next, advantageous effects obtainable by conducting the etchback of the resin film 11 employing the active hydrogen species in the present embodiment will be described in reference to the annexed figures.

FIRST EXAMPLE

Figure 7A:
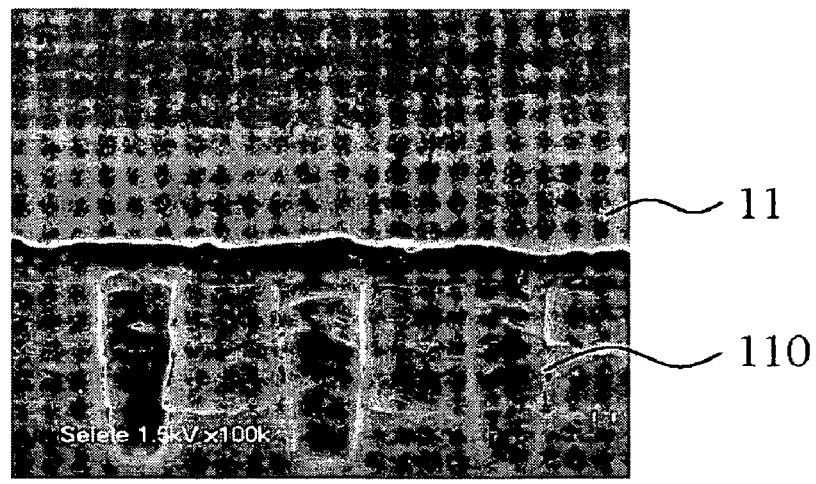
FIGS. 7A to 7C are cross-sectional views of configurations of a dual damascene interconnect.
Figure 7B:
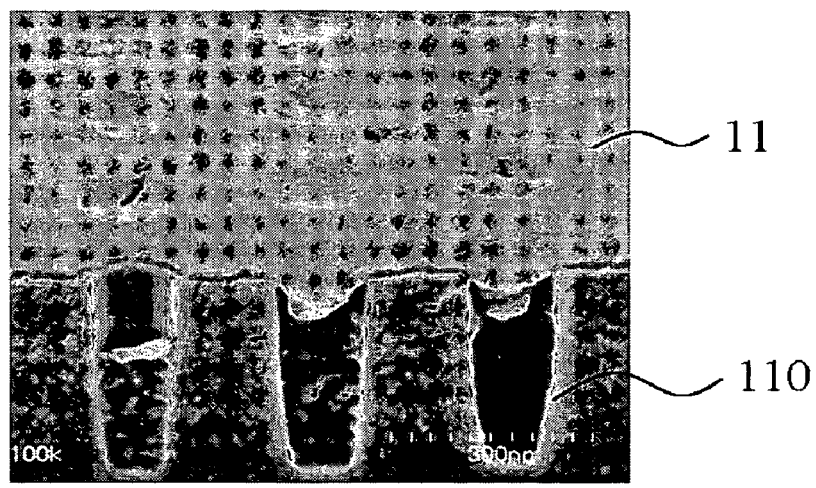
Figure 7C:
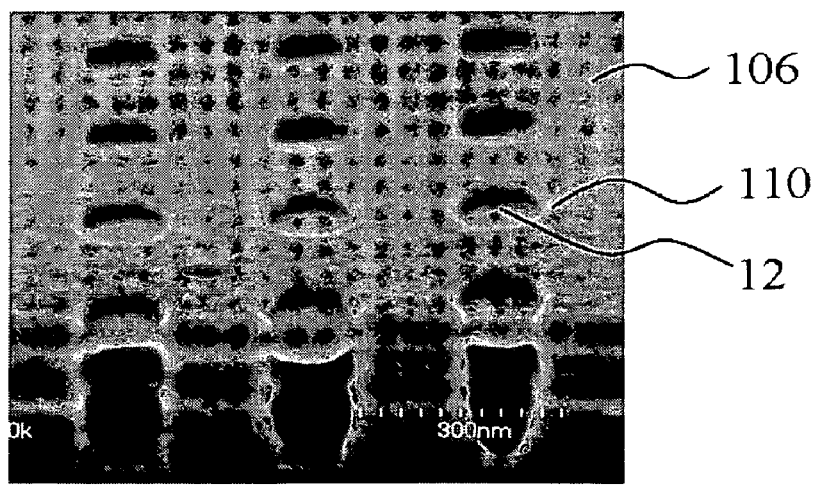

In first example, the etchback process for the resin film 11 was conducted by using the etching gas mainly containing an active hydrogen species from a start to an end point. FIGS. 7A to 7C are scanning electron microscope (SEM) structure showing cross-sectional views of a test element group (TEG) manufactured by etching back the resin film 11 in the above-described process.

In FIGS. 7A to 7C, same numeral number is assigned to same element appeared in FIGS. 2A to 2C. FIG. 7A represents a condition before etchback and corresponds to FIG. 2A. FIG. 7B presents a condition in a mid way of the etching process in the etchback process (half way), and the condition that the resin film 11 remains on the surface of the cap layer 106 is shown. FIG. 7C presents a condition of the end of etchback and corresponds to FIG. 2B.

In this case, a gaseous mixture of hydrogen gas and argon gas was employed and the gaseous mixture is plasma-excited, and then the obtained plasma-excited gas was utilized to conduct an etch back for the resin film 11. The above-described dual-frequency plasma-exciting parallel-plate RIE apparatus was employed for the plasma excitation of the gaseous mixture, and a hydrogen plasma was generated under the condition of a pressure in a plasma processing chamber of 26.6 Pa (200 mTorr), a power of radio frequency at 60 MHz of 1 kW, a power of radio frequency at 2 MHz of 100 W, an $H_2$ gas flow rate of 500 sccm and an Ar gas flow rate of 500 sccm. As shown in FIG. 7B, the surface roughness of the resin film 11 described in reference to FIG. 6B was not found at all in the operation of the etchback, and higher smoothness of the surface thereof was achieved. Further, it was found that considerably uniform etching for the resin film 11 in semiconductor wafer surface can be achieved by conducting the etchback that includes applying such hydrogen. Then, as can be seen from FIG. 7C, the dummy plug 12 that uniformly plugs the interior of the via hole 110 was formed. No protruding portion 112a of the dummy plug 12 as shown in FIG. 6C was found.

SECOND EXAMPLE

In second example, the etchback process for the resin film 11 was conducted in two stages. An etching gas containing active oxygen species was employed in the first stage, and an etching gas mainly containing an active hydrogen species was employed in the second stage. The etchback process of the first stage was conducted within a previously defined time period. The end point of the etchback in the second stage was determined on the basis of a detection result, presented by detecting a condition of the material composing the cap layer 106 being exposed by a measurement of the plasma emission intensity.

Figure 8A:
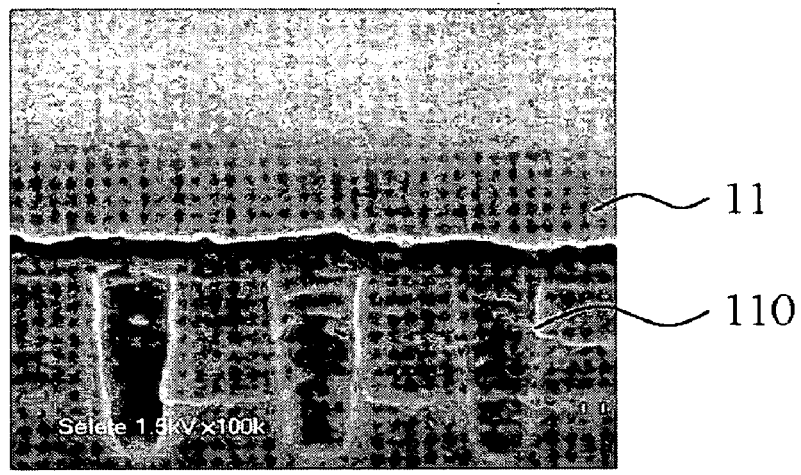
FIGS. 8A to 8C are cross-sectional views of configurations of a dual damascene interconnect.
Figure 8B:
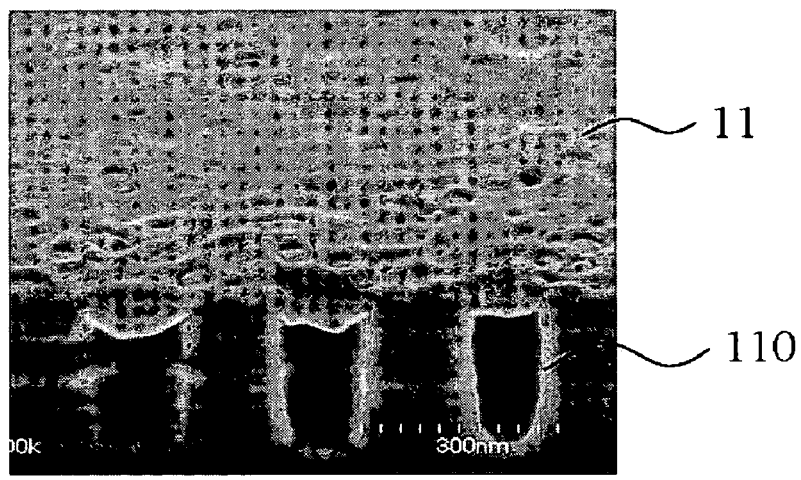
Figure 8C:
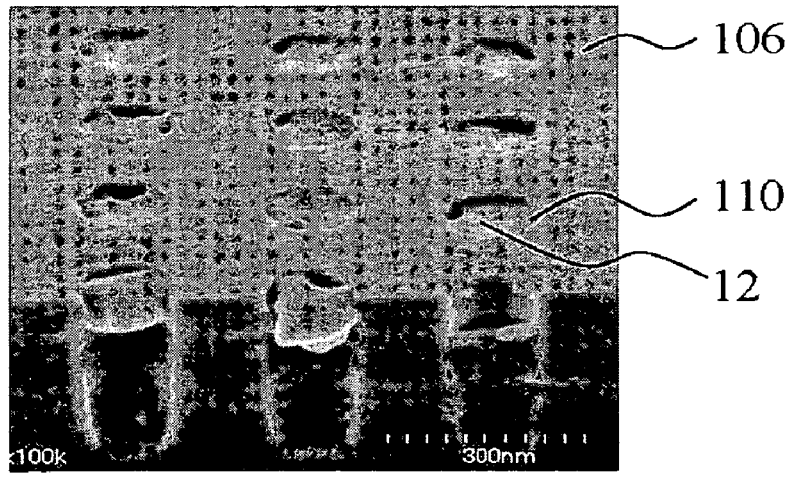

FIGS. 8A to 8C are scanning electron microscope (SEM) structures showing cross-sectional views of a test element group (TEG) manufactured by etching back the resin film 11 in the above-described process.

In FIGS. 8A to 8C, same numeral number is assigned to same element appeared in FIGS. 2A to 2C. FIG. 8A presents a condition before etchback and corresponds to FIG. 2A. FIG. 8B presents a condition in a mid way of the etching process in the etchback process (intermediate), and the condition that the resin film 11 remains on the surface of the cap layer 106 is shown. FIG. 8C presents a condition of the end of etchback and corresponds to FIG. 2B.

FIG. 8B shows a condition of the surface of the resin film 11 in a mid way of the etching process in the etchback process. In this etchback stage, similar level of the surface roughness of the resin film 11 as described above in reference to FIG. 6B had been found. However, the above-described surface roughness was not found in the end point of the second stage etchback process. As can be seen from FIG. 8C, the dummy plug 12 that uniformly plugs the interior of the via hole 110 was formed, similarly as in the case of the example shown in FIG. 7C. In this case, no protruding portion 112a of the dummy plug 12 as described in reference to FIG. 6C was found. Further, the time required for the etchback process in the example shown in FIGS. 8A to 8C was ⅓ of the time required for the etchback shown in FIGS. 7A to 7C, and thus the process time can be considerably reduced.

As described above, in the etchback process for the resin film 11, the process continued until the cap layer 106 is nearly exposed can be conducted by, for example, the etching employing an oxygen plasma. Even if such procedure is conducted, the electronic device can be formed without the problems described in reference to FIGS. 4A to 4C, FIG. 5 and FIGS. 6A to 6C.

In this example, the above-described dual-frequency plasma-exciting parallel-plate RIE apparatus may be employed for the dry etching apparatus, and the etchback processes of the first stage and the second stage may be sequentially conducted. Or alternatively, the etchback process can be conducted by employing different apparatuses for the first stage and the second stage. Alternatively, multiple-chamber etching apparatus may be employed to conduct consecutively conduct the first stage and the second stage in different chambers, respectively.

While the preferable embodiment of the present invention has been described as described above, it is not intended to limit the scope of the present invention to the embodiment described. It is possible for a person having ordinary skills in the art to modify and/or change the specific embodiments in various ways without departing from the scope and the spirits of the present invention.

As the active hydrogen species stated above, hydrogen radical except hydrogen ion may be employed. Such hydrogen radical may be created by employing a so-called remote plasma generating apparatus for hydrogen gas or a microwave downstream-type plasma apparatus. Although various structures are generally included in these types of apparatus, the basic structure thereof may include a plasma generation chamber and an etching chamber. The plasma generation chamber is capable of plasma-exciting a gas containing hydrogen to generate an active hydrogen species including hydrogen atom ion (proton), hydrogen molecular ion and hydrogen neutral radical. In such configuration, only hydrogen neutral radical having relatively longer lifetime and being remote from the plasma generation chamber is introduced into the etching chamber.

Here, the active hydrogen species may be generated by an excitation of a gaseous mixture of $H_2$ and inert gas via helicon wave plasma excitation, electron cyclotron resonance (ECR)

plasma excitation, microwave plasma excitation, inductively coupled plasma (ICP) excitation or the like, or via photo-excitation, as well as the above-described RIE.

In addition, as the active oxygen species stated above, oxygen radical may be employed as well as oxygen plasma. The active oxygen species may be generated by an excitation of a gaseous mixture of $O_2$ and inert gas via helicon wave plasma excitation, electron cyclotron resonance (ECR) plasma excitation, microwave plasma excitation, inductively coupled plasma (ICP) excitation or the like, or via photo-excitation, as well as the above-described RIE. Here, oxygen radical may be generated by the above-described process utilizing a remote plasma of oxygen or a micro wave-downstream plasma process.

For example, other insulating films having a siloxane backbone or an insulating film having a main backbone of an organic polymer, or an insulating film formed by porosifying thereof may be employed for the low-k film, in addition to the above-described SiOC film and MSQ film. In such case, the available insulating films having the above-described siloxane backbone may include, for example, a silica film containing at least one of Si—$CH_3$ bond, Si—H bond, and Si—F bond, which is an insulating film of silsesquioxanes. The available insulating films having the main backbone of the organic polymer may include, for example, "SiLK" (trademark of the Dow Chemical Company) consisting of an organic polymer. Further, well known insulating materials for the insulating film of silsesquioxanes include hydrogen silsesquioxane (HSQ), methylated hydrogen silsesquioxane (MHSQ) or the like. Further, SiOCH film deposited via a CVD may also similarly be employed.

In addition, SiN film may be employed as the via etch stop layer described above. In addition, $SiO_2$ film may be used for the cap layer. In addition, metal nitride film such as W film, WN film, WSiN film, Ti film, TiN film, TiSiN film or the like may be employed for such electroconductive barrier layer, which functions as a barrier layer in the copper-plugged damascene interconnect described above.

In addition, the damascene interconnect having the above-described via hole or trench plugged with other type of the electric conductor film may also be formed, in stead of plugged with copper or a copper alloy. In this case, a refractory metal film such as a tungsten (W) film or a gold (Au) film may be employed for the electric conductor film.

While the case of employing the low-k film as the interlayer insulating film between interconnects has been described in the above-described embodiment, it is not intended to limit the scope of the present invention to such insulating film, and the present invention may equally be applicable to cases where the interlayer insulating film is formed with an insulating film such as a silicon oxide film, a silicon nitride film, a silicon oxynitride film and the like.

Further, it should be noted that the present invention is not particularly limited to the case where the dual damascene interconnect is formed on the semiconductor substrate such as the silicon semiconductor substrate, the compound semiconductor substrate and the like. Alternatively, the present invention may also equally be applicable to cases where the interlayer insulating film is formed on a liquid crystal display substrate composing a display device or a plasma display substrate.

The present invention also includes the following configuration.

(1) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;

forming a resin film on the said interlayer insulating film, said resin film plugging said via hole;

etching said resin film with an etching gas containing an active hydrogen species to form a dummy plug composed of said resin film in said via hole;

forming a resist mask having an opening for an interconnect on said dummy plug and on said interlayer insulating film; and etching said interlayer insulating film via a dry etching process through an etching mask of said resist mask to form a trench for said interconnect, said trench being connected with said via hole.

(2) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;

forming a resin film on the said interlayer insulating film, said resin film plugging said via hole;

proceeding an etching of said resin film halfway with an etching gas containing an active oxygen species;

etching said resin film remaining on said interlayer insulating film with an etching gas containing an active hydrogen species to form a dummy plug composed of said resin film in said via hole;

forming a resist mask having an opening for an interconnect on said dummy plug and on said interlayer insulating film; and etching said interlayer insulating film via a dry etching process through an etching mask of said resist mask to form a trench for said interconnect, said trench being connected with said via hole.

In the above-described (1) and (2), said active hydrogen species may be preferably hydrogen plasma or hydrogen radical, which is created by plasma-exciting hydrogen gas or a gaseous mixture of hydrogen gas and an inert gas.

In the above-described (2), said active oxygen species may be preferably oxygen plasma or oxygen radical, which is created by plasma-exciting oxygen gas or a gaseous mixture of oxygen gas and an inert gas.

In the above-described (1) and (2), it may be preferable that said inert gas contains helium gas or argon gas.

It is apparent that the present invention is not limited to the above embodiment, that may be modified and changed without departing from the scope and spirit of the invention.

What is claimed is:

1. A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;

forming a resin film on said interlayer insulating film, said resin film plugging said via hole;

etching said resin film exposed outside said via hole with an etching gas containing an active oxygen species to remove a portion of said resin film formed on said insulating film;

after removing said portion of said resin film, etching said resin film exposed outside said via hole with an etching gas mainly containing an active hydrogen species to form a dummy plug composed of said resin film in said via hole;

forming a resist mask having an opening for an interconnect on said dummy plug and on said interlayer insulating film;

etching said interlayer insulating film through said resist mask to form a trench for said interconnect, said trench being connected with said via hole, said resin remaining in said via hole;

then removing said resin from said via hole; and filling said trench and said via hole with conductive material to form said interconnect.

2. The method according to claim 1, wherein said active hydrogen species is hydrogen plasma or hydrogen radical, which is created by plasma-exciting hydrogen gas or a gaseous mixture of hydrogen gas and an inert gas.

3. The method according to claim 1, wherein said active oxygen species is oxygen plasma or oxygen radical, which is created by plasma-exciting oxygen gas or a gaseous mixture of oxygen gas and an inert gas.

4. The method according to claim 1, further comprising forming an antireflection film before said forming the resist mask, wherein said resist mask is formed on said antireflection film in said forming said resist mask.

5. The method according to claim 1, wherein in said etching said resin film exposed outside said via hole with an etching gas mainly containing an active hydrogen species to form a dummy plug composed of said resin film in said via hole, a condition, in which said resin film on said insulating film except the region where said via is formed is removed to expose a material composing an underlying layer thereof having been exposed, is detected by utilizing a plasma luminescence, and based on the result of the detection, an end of the process is determined.

6. The method according to claim 1, wherein in said etching said resin film exposed outside said via hole with an etching gas mainly containing an active hydrogen species to form a dummy plug composed of said resin film in said via hole, a condition, in which said resin film on said insulating film except the region where said via is formed is removed to expose a material composing an underlying layer thereof having been exposed, is detected by utilizing a plasma luminescence, and based on the result of the detection, an end of the process is determined.

7. A method for manufacturing an electronic device, comprising:

forming a first interlayer insulating film;

forming a second interlayer insulating film over said first interlayer insulating film;

forming a via hole in said first and second interlayer insulating films;

forming a resin film on said second interlayer insulating film, said resin film plugging said via hole;

etching said resin film exposed outside said via hole with an etching gas containing an active oxygen species to remove a portion of said resin film formed on said second interlayer insulating film;

after removing said portion of said resin film, etching said resin film exposed outside said via hole using an etching gas mainly containing an active hydrogen species to form a dummy plug composed of said resin film in said via hole;

forming a resist mask on said dummy plug and on said second interlayer insulating film, said resist mask having an opening vertically above said via;

etching said second interlayer insulating film through said resist mask using a first etchant to form a trench in said second interlayer insulating film, said resin remaining in said via hole;

etching said resin using a second etchant different from said first etchant to remove said resin from said via hole.

8. The method according to claim 7, wherein said active oxygen species is oxygen plasma or oxygen radical, which is created by plasma-exciting oxygen gas or a gaseous mixture of oxygen gas and an inert gas.

9. The method according to claim 7, wherein said active hydrogen species is hydrogen plasma or hydrogen radical, which is created by plasma-exciting hydrogen gas or a gaseous mixture of hydrogen gas and an inert gas.

10. The method according to claim 7, further comprising forming an antireflection film before said forming the resist mask, said resist mask being formed on said antireflection film.

11. The method according to claim 7, wherein during said etching said resin film exposed outside said via hole, detecting whether a layer underlying said second interlayer insulating layer has been exposed, by utilizing a plasma luminescence, and determining and end of said etching said resin film exposed outside said via hole based on the result of the detection.

* * * * *